United States Patent
Bubb et al.

(10) Patent No.: US 10,301,220 B2
(45) Date of Patent: May 28, 2019

(54) COMPOSITIONS AND METHODS FOR PLUGGING HONEYCOMB BODIES WITH REDUCED PLUG DEPTH VARIABILITY

(71) Applicant: CORNING INCORPORATED, Corning, NY (US)

(72) Inventors: Keith Norman Bubb, Beaver Dams, NY (US); Anthony Joseph Cecce, Elmira, NY (US); Allison Elizabeth Cronin, Painted Post, NY (US); Huthavahana Kuchibhotla Sarma, Painted Post, NY (US); Courtney Spencer Warren, Waverly, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/163,429

(22) Filed: May 24, 2016

(65) Prior Publication Data

US 2016/0264472 A1   Sep. 15, 2016

Related U.S. Application Data

(60) Division of application No. 13/833,753, filed on Mar. 15, 2013, now Pat. No. 9,359,262, which is a
(Continued)

(51) Int. Cl.
*C04B 35/195* (2006.01)
*C23C 16/44* (2006.01)
(Continued)

(52) U.S. Cl.
CPC .......... *C04B 35/195* (2013.01); *B01D 46/244* (2013.01); *B01D 46/2429* (2013.01);
(Continued)

(58) Field of Classification Search
None
See application file for complete search history.

(56) References Cited

U.S. PATENT DOCUMENTS

| 6,696,132 B2 | 2/2004 | Beall et al. |
| 7,166,328 B1 | 1/2007 | Davies et al. |

(Continued)

FOREIGN PATENT DOCUMENTS

| EP | 1437168 A1 | 7/2004 |
| EP | 2070890 A2 | 6/2009 |

(Continued)

OTHER PUBLICATIONS

Journal Homepage Soft Matter, 2012, 8, 10036 Formation of hollow spherical and doughnut microcapsules by evaporation D. Sen, J. Bahadur, S. Mazumderm, S. Bhattacharya Received Jun. 27, 2012, Accepted Jul. 17, 2012-Paper.

(Continued)

*Primary Examiner* — David Sample

(57) ABSTRACT

A composition for applying to a honeycomb body includes a refractory filler, an organic binder, an inorganic binder, and a liquid vehicle, wherein the refractory filler, the particle size distribution of the refractory filler, the organic binder, and the inorganic binder are selected such that, when the composition is applied to plug a plurality of channels of the honeycomb body, the plug depth variability is reduced.

14 Claims, 11 Drawing Sheets

Related U.S. Application Data continuation-in-part of application No. 13/599,584, filed on Aug. 30, 2012, now Pat. No. 8,999,484.

(51) Int. Cl.

| | |
|---|---|
| *B01D 46/24* | (2006.01) |
| *C04B 28/24* | (2006.01) |
| *C04B 35/18* | (2006.01) |
| *C04B 35/185* | (2006.01) |
| *C04B 35/19* | (2006.01) |
| *C04B 35/44* | (2006.01) |
| *C04B 35/478* | (2006.01) |
| *C04B 35/565* | (2006.01) |
| *C04B 35/584* | (2006.01) |
| *C04B 38/00* | (2006.01) |

(52) U.S. Cl.
CPC .......... *B01D 46/2459* (2013.01); *C04B 28/24* (2013.01); *C04B 35/18* (2013.01); *C04B 35/185* (2013.01); *C04B 35/19* (2013.01); *C04B 35/44* (2013.01); *C04B 35/478* (2013.01); *C04B 35/565* (2013.01); *C04B 35/584* (2013.01); *C04B 38/0012* (2013.01); *C23C 16/44* (2013.01); *B01D 2046/2437* (2013.01); *C04B 2235/3418* (2013.01); *C04B 2235/3481* (2013.01); *C04B 2235/48* (2013.01); *Y10T 428/24157* (2015.01)

(56) References Cited

U.S. PATENT DOCUMENTS

| | | | |
|---|---|---|---|
| 7,429,285 | B2 | 9/2008 | Kuki et al. |
| 8,087,450 | B2 | 1/2012 | Nycz et al. |
| 8,182,603 | B2 | 5/2012 | Cecce et al. |
| 8,609,002 | B2 | 12/2013 | Cecce et al. |
| 9,353,015 | B2 | 5/2016 | Okazaki |
| 2005/0103232 | A1 | 5/2005 | Gadkaree et al. |
| 2006/0272306 | A1 | 12/2006 | Kirk et al. |
| 2007/0210485 | A1 | 9/2007 | Hatano et al. |
| 2008/0010960 | A1 | 1/2008 | Paisley et al. |
| 2008/0274972 | A1 | 11/2008 | Kino et al. |
| 2008/0307760 | A1 | 12/2008 | Chatlani et al. |
| 2009/0033005 | A1 | 2/2009 | Bookbinder et al. |
| 2009/0033006 | A1 | 2/2009 | Horng |
| 2009/0142499 | A1 | 6/2009 | Cecce et al. |
| 2009/0283928 | A1 | 11/2009 | Ito et al. |
| 2009/0286041 | A1 | 11/2009 | Deneka et al. |
| 2009/0295009 | A1 | 12/2009 | Brown et al. |
| 2009/0304560 | A1 | 12/2009 | Dietz |
| 2012/0142518 | A1* | 6/2012 | Pattillo ............. C04B 35/62665 501/89 |
| 2012/0301664 | A1 | 11/2012 | Chapman et al. |
| 2013/0136893 | A1 | 5/2013 | Bubb et al. |

FOREIGN PATENT DOCUMENTS

| | | | |
|---|---|---|---|
| JP | 2011212582 A | 10/2011 | |
| JP | 2011230028 A | 11/2011 | |
| JP | 2012045926 A | 3/2012 | |
| WO | 2006130711 | 12/2006 | |
| WO | 2008008332 | 1/2008 | |
| WO | 2008008332 A2 | 1/2008 | |
| WO | 2008115378 | 9/2008 | |
| WO | 2009070250 | 6/2009 | |
| WO | WO 2013030301 A1 * | 3/2013 | ....... C04B 35/62665 |
| WO | 2013082339 | 6/2013 | |

OTHER PUBLICATIONS

Journal of the European Ceramic Society 21 (2001) 795-808Silica sols as refractory fibre binders E. Liden a,*, S. Karlsson a, B. Tokarz b "Swedish Ceramic Institute, Box 5403, S-402 29 GO" teborg, Sweden b£ka Chemicals AB, S-445 80 Bohus, Swededn Recieved May 10, 2000; recieved in revised form Sep. 15, 2000; accepted Sep. 21, 2000.

LUDOX Data Sheet Printed in Germany Mar. 1, 2012 /Ref: ludox_br_E_2012 / studiohauck.

LUDOX® Colloidal Silica in Coatings Lithium Polysilicate in Coatings-Grace Davision Engineered Materials.

PCT Notification of Transmittal of the International Search Report and the Written Opinion of the International Searching Authority, PCT/US2013/057222, dated Nov. 14, 2013, 9 pages.

EP Application No. 13762334.4 Office Action dated Apr. 16, 2015.

PCT Notification of Transmittal of the International Search Report and the Written Opinion of the International Searching Authority, PCT/US2013/057036, dated Nov. 14, 2013, 10 pages.

EP Application No. 13762643.8 Office Action dated Apr. 9, 2015.

English Translation of JP2015530020 Office Action dated Feb. 21, 2017, Japan Patent Office.

English Translation of JP2015529990 Office Action dated Mar. 28, 2017, Japan Patent Office.

European Patent Application No. 13762334.4 Office Action dated Nov. 22, 2018; 6 Pages; European Patent Office.

* cited by examiner

COMPOSITIONS AND METHODS FOR PLUGGING HONEYCOMB BODIES WITH REDUCED PLUG DEPTH VARIABILITY

CROSS REFERENCE TO RELATED APPLICATION

This application is a Divisional of U.S. patent application Ser. No. 13/833,753, filed on Mar. 15, 2013, which is a Continuation-in-Part of U.S. patent application Ser. No. 13/599,584, filed on Aug. 30, 2012, both of which are hereby incorporated by reference for all purposes as if fully set forth herein.

BACKGROUND

The disclosure relates generally to porous honeycomb ceramics and more particularly to improved compositions that can be applied to porous honeycomb ceramics.

Ceramic wall flow filters are finding widening use for the removal of particulate pollutants from diesel or other combustion engine exhaust streams. A number of different approaches for manufacturing such filters from channeled honeycomb structures formed of porous ceramics are known. The most widespread approach is to position cured plugs of sealing material at the ends of alternate channels of such structures, which can block direct fluid flow through the channels and force the fluid stream through the porous channel walls of the honeycombs before exiting the filter.

Important aspects of plugging honeycomb structures include plug depth and plug quality. Plug quality is often correlated to the presence of voids in the plugs. In general, the presence of voids can be reduced by reducing the amount of water in the plugging composition and/or increasing the particle size of certain batch components in the plugging composition. However, such modifications can lead to plugs with insufficient depth and, hence, insufficient mechanical (or "push out") strength.

On the other hand, shorter plugs provide less back pressure, higher filter volume for the same external geometry, thus reducing the frequency of regenerations and improving fuel economy. Moreover, shorter plugs provide better material utilization, thereby reducing filter manufacturing costs. Accordingly, it is desirable to provide plugs that are as short as possible while still having the requisite depth to provide sufficient mechanical (or "push out") strength.

A challenge for simultaneously addressing all of these considerations involves plug depth variability. Plug depth variability is typically driven by differences in the flow rate of a plugging composition in different filter channels. Plugs in channels where there is relatively more resistance to flow tend to be shorter whereas plugs in channels where there is relatively less resistance to flow tend to be longer. Such variability can result in at least some relatively shorter plugs failing to provide requisite mechanical strength. Accordingly, given the ever increasing need to provide for shorter plugs, there simultaneously exists a need to provide for reduced plug depth variability in order to minimize the incidence of plugs that fail to provide requisite mechanical strength.

SUMMARY

One embodiment of the disclosure relates to a composition for applying to a honeycomb body having a plurality of parallel channels. The composition includes a refractory filler having a particle size distribution. The composition also includes an organic binder, an inorganic binder, and a liquid vehicle. The refractory filler, the particle size distribution of the refractory filler, the organic binder, and the inorganic binder are selected such that, when the composition is applied to plug a plurality of channels of the honeycomb body, a plurality of plugs formed therefrom have an average plug depth and a depth range, such that for channels of a given cross-sectional size, the depth range is less than 30% of the average plug depth.

Another embodiment of the disclosure relates to a porous ceramic honeycomb body comprising a plurality of parallel channels bounded by porous ceramic channel walls. Selected channels incorporate plugs permanently sealed to the channel walls. The plugs include a refractory filler having a particle size distribution and an inorganic binder. The refractory filler, the particle size distribution of the refractory filler, and the inorganic binder are selected such that the plugs have an average plug depth and a depth range, such that for channels of a given cross-sectional size, the depth range is less than 30% of the average plug depth.

Yet another embodiment of the disclosure relates to a method for applying a plugging composition to a honeycomb body having a plurality of parallel channels. The method includes applying a composition to the honeycomb body. The composition includes a refractory filler having a particle size distribution. The composition also includes an organic binder, an inorganic binder, and a liquid vehicle. The refractory filler, the particle size distribution of the refractory filler, the organic binder, and the inorganic binder are selected such that, when the composition is applied to plug a plurality of channels of the honeycomb body, a plurality of plugs formed therefrom have an average plug depth and a depth range, such that for channels of a given cross-sectional size, the depth range is less than 30% of the average plug depth.

Additional features and advantages will be set forth in the detailed description which follows, and in part will be readily apparent to those skilled in the art from the description or recognized by practicing the embodiments as described in the written description and claims hereof, as well as the appended drawings.

Exemplary embodiments of the present disclosure provide a composition for applying to a honeycomb body having a plurality of parallel channels. The composition includes a refractory filler having a particle size distribution. The composition also includes an organic binder, an inorganic binder, and a liquid vehicle. The inorganic binder comprises a polydisperse colloidal silica.

Exemplary embodiments of the present disclosure also provide a porous ceramic honeycomb body comprising a plurality of parallel channels bounded by porous ceramic channel walls. Selected channels incorporate plugs permanently sealed to the channel walls. The plugs include a refractory filler having a particle size distribution and an inorganic binder. The inorganic binder comprises a polydisperse colloidal silica.

An exemplary embodiment of the present disclosure also provides a method for applying a plugging composition to a honeycomb body having a plurality of parallel channels. The method includes applying a composition to the honeycomb body. The composition includes a refractory filler having a particle size distribution. The composition also includes an organic binder, an inorganic binder, and a liquid vehicle. The inorganic binder comprises a polydisperse colloidal silica.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Figure 1:
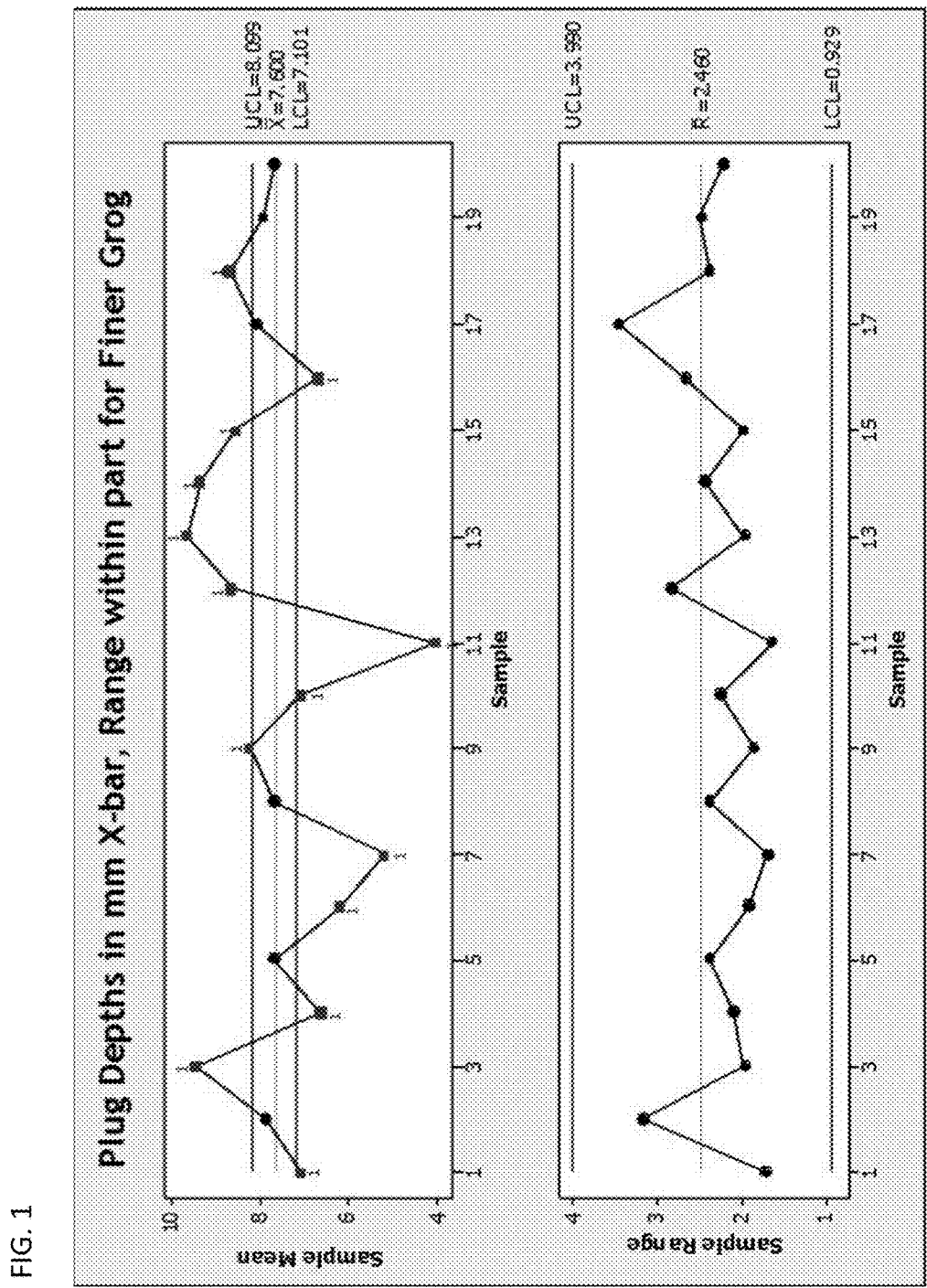
FIG. 1 plots average plug depth and plug depth range for plugs applied to a honeycomb structure according to a comparative plugging composition.

Various embodiments of the disclosure will be described in detail with reference to the drawings.

As used herein, the term "average plug depth" refers to the total depth (or length) of all of the plugs in a given area (such as on one or more end faces of a honeycomb body) divided by the number of plugs in that area.

As used herein, the term "depth range" refers to the difference in depth between the deepest (or longest) plug in a given area (such as on one or more end faces of a honeycomb body) and the shallowest (or shortest) plug in that area.

As used herein, the term "channels of a given cross sectional size" refers to channels of a honeycomb body that have the same approximate cross sectional dimensions. For example, for a honeycomb body having ACT cell geometry as described in U.S. Pat. No. 6,696,132, channels of a given cross sectional size could refer to the collective inlet cell channels (shown as 14 in FIG. 3 of that patent) having a relatively larger hydraulic diameter or to the collective outlet cell channels (shown as 16 in FIG. 3 of that patent) having a relative smaller hydraulic diameter.

As used herein, the term "push out strength" refers to the pressure (in bars, unless otherwise indicated) required to push a given plug out of a given channel. Plug push out strength can be determined by either pushing a plug from the top (i.e., side closest to part end face) or bottom (i.e., side farthest from part end face). In either case, a load cell is utilized to push a pin into the plug, wherein the pin cross-sectional area is optimally about 70% of the cross section of the plugged cell. When pushed from the top, the force required to push the tooling 0.2 inches into the plug is recorded. When pushed from the bottom, the force required to break through the plug and remove it from the face is recorded. When pushing from the top, the tooling includes three pins, one to push the plug and two for alignment. When pushing from the bottom, the cell walls provide guidance and only the pushing pin is needed.

As used herein, the term $D_{10}$ refers to a particle size wherein 90% of the particles in a distribution have a larger particle size and 10% of the particles in a distribution have a smaller particle size.

As used herein, the term $D_{90}$ refers to a particle size wherein 90% of the particles in a distribution have a smaller particle size and 10% of the particles in a distribution have a larger particle size.

As used herein, the term $D_{50}$ refers to a particle size where 50% of the particles in a distribution have a smaller particle size and 50% of the particles in a distribution have a larger particle size.

As used herein, the term "D factor" $(D_f)=(D_{50}-D_{10})/D_{50}$.

As used herein, the term "D breadth" $(D_{breadth})=(D_{90}-D_{10})/D_{50}$.

Embodiments disclosed herein include compositions for applying to a honeycomb body having a plurality of parallel channels, such as compositions for plugging one or more channels of a honeycomb body having a plurality of parallel channels. The compositions include a refractory filler having a particle size distribution, an organic binder, an inorganic binder, and a liquid vehicle. The refractory filler, the particle size distribution of the refractory filler, the organic binder, and the inorganic binder are selected such that, when the composition is applied to plug a plurality of channels of the honeycomb body, a plurality of plugs formed therefrom have an average plug depth and a depth range, such that for channels of a given cross-sectional size, the depth range is less than 30% of the average plug depth, such as less than 25% of the average plug depth, and further such as less than 20% of the average plug depth, including between 10% and 30% of the average plug depth and further including between 15% and 25% of the average plug depth.

In certain exemplary embodiments, the average plug depth is less than 7 millimeters, such as less than 6 millimeters, and further such as less than 5 millimeters, including from 4 to 7 millimeters, and further including from 4 to 6 millimeters, and yet further including from 4 to 5 millimeters. In such embodiments, the depth range of the plugs is less than 2.1 millimeters, such as less than 1.8 millimeters, and further such as less than 1.5 millimeters, and still yet further such as less than 1.2 millimeters, and even still yet further such as less than 1.0 millimeters, including between 0.5 and 2.1 millimeters, and further including between 0.5 and 1.5 millimeters, and yet further including between 0.5 millimeters and 1.0 millimeters.

Embodiments disclosed herein can enable plugs meeting the above-disclosed average plug depth and depth range parameters wherein all of the plurality of plugs in the channels have a push out strength of at least 10 bar, such as at least 15 bar, and further such as at least 20 bar, and still yet further such as at least 25 bar. Such plugs can have an average push out strength of at least 50 bar, such as at least 60 bar, and further such as at least 70 bar, and still yet further such as at least 80 bar.

The refractory filler can include at least one inorganic powder. The inorganic powder may, for example, include a ceramic, i.e., pre-reacted or ceramed, refractory powder. In other embodiments, the powders can be refractory glass powders, or glass-ceramic powders. Still further, in other embodiments the inorganic powder batch mixture can comprise any combination of two or more of the aforementioned refractory powders. Exemplary refractory powders may include cordierite, mullite, aluminum titanate, silicon carbide, silicon nitride, calcium aluminate, beta-eucryptite, and beta-spodumene.

The particle size distribution of the refractory filler can fall within a predetermined specified range. In that regard, applicants have surprisingly found that maintaining the particle size distribution of the refractory filler within a specified range, in combination with specified combinations of organic and inorganic binders, can result in plugging compositions that enable reduced plug depth variability. In particular, applicants have found that by keeping the particle size distribution of the refractory filler within a specified range, in combination with specified combinations of organic and inorganic binders, channels of a honeycomb body can be plugged with the resulting composition, wherein the flow of the composition into the channels becomes restricted due to syneresis. As the composition penetrates further into the channels, the velocity of the flow slows down and eventually stops. This allows plugging composition in slower flowing channels to catch up to plugging composition in channels that initially flows faster. This phenomenon, thus, reduces the depth variability of the plugs.

Accordingly, in certain exemplary embodiments, the refractory filler includes at least one inorganic powder having a median particle size ($D_{50}$) of at least 15 microns, such as a median particle size ($D_{50}$) of from 15 to 50 microns, and further such as a median particle size ($D_{50}$) of from 18 to 40 microns, and still further such as a median particle size ($D_{50}$) of from 30 to 40 microns, and even further such as a median particle size ($D_{50}$) of from 30 to 35 microns.

In certain exemplary embodiments, the inorganic powder has a $D_{10}$ of at least 4 microns, such as at least 6 microns, and further such as at least 8 microns, and yet further such as at least 10 microns, including from 4 to 16 microns, and further including from 8 to 14 microns, and still further including from 10 to 12 microns.

In certain exemplary embodiments, the inorganic powder has a $D_{90}$ of at least 55 microns, such as at least 65 microns, and further such as at least 75 microns, and yet further such as at least 85 microns, including from 55 to 120 microns, and further including from 75 to 110 microns, and still further including from 85 to 100 microns.

In certain exemplary embodiments, the inorganic powder has a median particle size ($D_{50}$) of from 15 to 50 microns, and further such as a median particle size ($D_{50}$) of from 20 to 45 microns, and even further such as a median particle size ($D_{50}$) of from 25 to 40 microns, and yet even further such as a median particle size ($D_{50}$) of from 30 to 35 microns, has a $D_{10}$ of from 4 to 16 microns, and further including from 8 to 14 microns, and still further including from 10 to 12 microns, and a $D_{90}$ of from 55 to 120 microns, and further including from 75 to 110 microns, and still further including from 85 to 100 microns.

For example, in one set of exemplary embodiments, the refractory filler comprises aluminum titanate powder having a median particle size ($D_{50}$) of at least 15 microns, such as a median particle size of ($D_{50}$) of from 15 to 50 microns, and further such as a median particle size ($D_{50}$) of from 20 to 45 microns, and even further such as a median particle size ($D_{50}$) of from 25 to 40 microns, and yet even further such as a median particle size ($D_{50}$) of from 30 to 35 microns. In one set of exemplary embodiments, the refractory filler comprises cordierite powder having a median particle size ($D_{50}$) of at least 10 microns, such as a median particle size of ($D_{50}$) of from 15 to 50 microns, and further such as a median particle size ($D_{50}$) of from 15 to 40 microns, and even further such as a median particle size ($D_{50}$) of from 20 to 30 microns. In one set of exemplary embodiments, the refractory filler comprises mullite powder having a median particle size ($D_{50}$) of at least 15 microns, such as a median particle size of ($D_{50}$) of from 15 to 50 microns, and further such as a median particle size ($D_{50}$) of from 25 to 40 microns, and even further such as a median particle size ($D_{50}$) of from 30 to 35 microns.

The compositions further comprise a binder component comprised of an inorganic binder. In some embodiments, the inorganic binder is a gelled inorganic binder such as gelled colloidal silica. Other embodiments of an inorganic binder could include a non-gelled colloidal silica, a powdered silica, or a low-temperature glass. According to embodiments, the incorporation of a gelled inorganic binder may minimize or even prevent the migration of the inorganic binder particles into microcracks of a honeycomb body on which the composition is applied. Accordingly, as used herein, the term "gelled inorganic binder" refers to a colloidal dispersion of solid inorganic particles in which the solid inorganic particles form an interconnected network or matrix in combination with a continuous fluid phase, resulting in a viscous semi-rigid material. Further, it should be understood that there can be relative levels or degrees of gelation. To that end, since a colloidal dispersion can comprise solid particles having particle sizes diameters less than 100 nm, such as less than 50 nm, and further such as less than 25 nm, and still further such as less than 15 nm, a gelled inorganic binder as used herein comprises an interconnected network of the dispersed inorganic particles that is sufficient to prevent at least a portion of the inorganic binder particles from migrating into microcracks of a honeycomb structure upon which the composition containing the gelled inorganic binder has been applied.

The gelled inorganic binder may be pre-gelled prior to introducing the inorganic binder into the powder composition. Alternatively, in other embodiments, the inorganic binder can be gelled after it has been combined with one or more other components of the disclosed compositions. For example, in embodiments of the disclosure, the inorganic binder component of the composition can initially comprise a non-gelled colloidal silica which is subsequently gelled after being incorporated into the powdered batch composition. To that end, dispersed-phase inorganic particles within a colloid can be largely affected by the surface chemistry present in the colloid and, as such, in embodiments the gelation of a colloid can be effected by altering the surface chemistry within the colloid.

Accordingly, the non-gelled colloidal silica can subsequently be gelled by the addition of one or more gelling agents to the composition. In embodiments, colloidal silica may be gelled by increasing the ion concentration of the composition. In other embodiments, colloidal silica can be gelled by altering the pH of the composition. Still further embodiments can comprise both increasing the ion concentration and altering the pH of the composition. It should be understood that the gelling agent can be used in any amount effective to provide a gelled inorganic binder as described herein.

Exemplary gelling agents that function to increase the ion concentration of the disclosed composition, i.e., ion increasing gelling agents, include one or more water soluble salts. To that end, exemplary water soluble salts that are suitable gelling agents include magnesium salts such as magnesium chloride, or magnesium acetate, calcium salts such as calcium chloride, or even sodium salts such as sodium chloride. Still further, in embodiments of the invention the use of salts comprising $2^+$ cations, such as Mg and Ca, can be particularly effective to gel an inorganic binder component at relatively low salt concentrations.

As noted above, an inorganic binder such as colloidal silica can also be gelled by altering the pH of the composition. To that end, the pH of the disclosed compositions can be increased or decreased by the use of a pH adjusting gelling agent comprising an acid, a base, or with a combination of an acid and a base. Exemplary pH adjusting gelling agents are acid gelling agents which include, without limitations hydrochloric acid, sulfuric acid, and nitric acid. In still another exemplary embodiment, the acid gelling agent may include organic acids such as citric acid, and acetic acid. Exemplary pH adjusting gelling agent comprising base gelling agents include, without limitation, ammonium hydroxide, sodium hydroxide, and triethanol amine (hereinafter "TEA").

According to embodiments, increasing the ion concentration of the composition by the addition of a salt or salt solution can result in non-uniform gelation due to the non-uniform salt concentrations throughout the composition and particularly at or near the region where the ion increasing gelling agent was introduced. According to these embodiments, a more uniform and controlled gelation may be achieved by a combination of one or more ion increasing gelling agents and one or more pH adjusting gelling agents. For example, the ion concentration of the composition can initially be increased within a first pH range having a relatively longer gel times. The pH of the composition can then be adjusted to a second pH range exhibiting relatively shorter gel times. Therefore, since some colloidal silica solutions exhibit a minimum gel time as a function of pH, local deviations in pH will not result in any substantially non-uniform gelations.

In embodiments of the disclosure, one exemplary combination of an ion increasing gelling agent and a pH adjusting gelling agent comprises the use of TEA as both a base and a salt in a colloidal silica solution having a relatively high stability at relatively high pH. Exemplary colloidal silicas can include the Ludox® HS, AS, SK, PW50, and PZ50 available from W.R. Grace & Company, and can be gelled by increasing the ion concentration by addition of salts and/or by changing the pH. According to this embodiment, TEA can first be added to the colloidal silica, rendering a relatively stable colloidal silica solution. The pH of the solution may then be lowered by the addition of an acid, such as citric acid, followed by thorough mixing and gel formation.

Exemplary compositions disclosed herein may further comprise an organic binder. The addition of the organic binder component can further contribute to the cohesion and plasticity of the composition prior to firing. This improved cohesion and plasticity can, for example, improve the ability to shape the composition. This can be advantageous when utilizing the composition to form skin coatings or when plugging selected portions (such as the ends) of a honeycomb structural body. Exemplary organic binders include cellulose materials. Exemplary cellulose materials include cellulose ether binders such as methylcellulose, hydroxypropyl methylcellulose, methylcellulose derivatives, and/or any combinations thereof. Particularly preferred examples include methylcellulose and hydroxypropyl methylcellulose. Preferably, the organic binder can be present in the composition as a super addition in an amount in the range of from 0.1 weight percent to 5.0 weight percent of the inorganic powder batch composition, or even in an amount in the range of from 0.5 weight percent to 2.0 weight percent of the inorganic powder batch composition.

An exemplary liquid vehicle for providing a flowable or paste-like consistency to the disclosed compositions is water, although other liquid vehicles can be used. To this end, the amount of the liquid vehicle component can vary in order to provide optimum handling properties and compatibility with the other components in the batch mixture. According to some embodiments, the liquid vehicle content is present as a super addition in an amount in the range of from 15% to 60% by weight of the inorganic powder batch composition, or even according to some embodiments can be in the range of from 20% to 50% by weight of the inorganic powder batch mixture. Minimization of liquid components in the compositions can also lead to further reductions in the drying shrinkage of the compositions during the drying process.

Exemplary compositions disclosed herein can optionally comprise one or more processing aids such as a plasticizer, lubricant, surfactant, sintering aid, rheology modifier, thixotropic agent, dispersing agents, or pore former. An exemplary plasticizer for use in preparing the plugging composition is glycerine. An exemplary lubricant can be a hydrocarbon oil or tall oil. Exemplary commercially available lubricants include Liga GS, available from Peter Greven Fett-Chemie and Durasyn® 162 hydrocarbon oil available from Innovene. A commercially available thixotropic agent is Benaqua 1000 available from Rheox, Inc. A pore former, may also be optionally used to produce a desired porosity of the resulting ceramed composition. Exemplary and non-limiting pore formers can include graphite, starch, polyethylene beads, and/or flour. Exemplary dispersing agents that can be used include the NuoSperse® 2000 from Elementis and ZetaSperse® 1200, available from Air Products and Chemicals, Inc.

In still other embodiments of the disclosed compositions, the gelation of colloidal silica can result in compositions having rheological properties which may benefit from further modification. For example, the compositions may be too thick for an intended use or may have low solids loadings resulting in the formation of pinholes or shrinkage during drying. While such rheology can be desirable and advantageous in some applications, the addition of a rheology modifier as noted above can be used to further control the rheology of the composition. To that end, in some embodiments, an exemplary rheology modifier is polyvinyl alcohol (PVOH). Both cold-water and hot-water soluble polyvinyl alcohol may be used. Compositions comprising polyvinyl alcohol can exhibit relatively lower viscosity at relatively higher solids loading, while still preventing the colloidal particles from migrating into microcracks of the honeycomb body on which the composition is applied. When used, the polyvinyl alcohol can first be mixed with the colloidal silica and, optionally the ceramed refractory powder prior to the addition of the gelling agent. Compositions comprising the polyvinyl alcohol rheology modifier enable gel formation but without the formation of a full three-dimensional gelled connectivity throughout the composition, resulting in a gelled state that flows relatively easily.

To prepare exemplary compositions as disclosed herein, the inorganic powder batch mixture as described above can be mixed together with the organic binder, followed by the incorporation of the liquid vehicle and inorganic binder components. As mentioned above, the inorganic binder can be gelled either before or after having been introduced into the composition. If the inorganic binder is to be gelled prior to addition to the composition, the one or more gelling agents can be added to the inorganic binder, such as for example, a colloidal silica. Alternatively, if the inorganic binder is to be gelled after addition to the powder composition, the one or more gelling agents can be introduced directly into the composition. Any optional processing aids can also be introduced into the composition during or after the liquid addition. However, as noted above, if desired the rheology modifier, such as polyvinyl alcohol can first be mixed with the inorganic binder and, optionally the refractory powder. Once the desired components are combined, the composition can be thoroughly mixed to provide a flowable paste-like consistency to the composition. In an exemplary embodiment, the mixing as described above can be done using a Littleford mixer or a Turbula mixer.

Once formed, the compositions disclosed herein can be applied to a honeycomb body or structure defining a plurality of cell channels bounded by cell channel walls. In exemplary embodiments, the wall thickness of each cell wall for the substrate can be, for example, between about 0.002 to about 0.010 inches (about 51 to about 254 µm). The cell density can be, for example, from about 100 to about 900 cells per square inch (cpsi). In certain exemplary implementations, the cellular honeycomb structure can consist of multiplicity of parallel cell channels of generally square cross section formed into a honeycomb structure. Alternatively, other cross-sectional configurations may be used in the honeycomb structure as well, including rectangular, round, oblong, triangular, octagonal, hexagonal, or combinations thereof. As used herein, "honeycomb" refers to the connected structure of longitudinally-extending cells formed of cell walls, having a generally repeating pattern therein.

The honeycomb body can be formed from any conventional material suitable for forming a honeycomb body. For example, in one embodiment, the honeycomb body can be formed from a plasticized ceramic forming composition. Exemplary ceramic forming compositions can include those conventionally known for forming cordierite, aluminum titanate, silicon carbide, aluminum oxide, zirconium oxide, zirconia, magnesium, stabilized zirconia, zirconia stabilized alumina, yttrium stabilized zirconia, calcium stabilized zirconia, alumina, magnesium stabilized alumina, calcium stabilized alumina, Mania, silica, magnesia, niobia, ceria, vanadia, nitride, carbide, or any combination thereof.

The honeycomb body can be formed according to any conventional process suitable for forming honeycomb monolith bodies. For example, in one embodiment a plasticized ceramic forming batch composition can be shaped into a green body by any known conventional ceramic forming process, such as, e.g., extrusion, injection molding, slip casting, centrifugal casting, pressure casting, dry pressing, and the like. Typically, a ceramic precursor batch composition comprises inorganic ceramic forming batch component(s) capable of forming, for example, one or more of the ceramic compositions set forth above, a liquid vehicle, a binder, and one or more optional processing aids including, for example, surfactants, sintering aids, plasticizers, lubricants, and/or a pore former. In an exemplary embodiment, extrusion can be done using a hydraulic ram extrusion press, or a two stage de-airing single auger extruder, or a twin screw mixer with a die assembly attached to the discharge end. In the latter, the proper screw elements are chosen according to material and other process conditions in order to build up sufficient pressure to force the batch material through the die. Once formed, the green body can be fired under conditions effective to convert the ceramic forming batch composition into a ceramic composition. Optimum firing conditions for firing the honeycomb green body will depend, at least in part, upon the particular ceramic forming batch composition used to form the honeycomb green body.

In exemplary embodiments, the compositions disclosed herein can be used as plugging material to plug selected channels of a honeycomb body in order to form a wall flow filter. For example, in a honeycomb body having a plurality of cell channels bounded by porous cell channel walls, at least a portion of the plurality of cell channels can comprise plugs, wherein the plugs are formed from a composition as disclosed herein. In some embodiments, a first portion of the plurality of cell channels can comprise a plug sealed to the respective channel walls at or near the downstream outlet end to form inlet cell channels. A second portion of the plurality of cell channels can also comprise a plug sealed to the respective channel walls at or near the upstream inlet end to form outlet cell channels. Other configurations having only one end plugged, as well as partially plugged configurations (having some unplugged channels) are also contemplated.

In other embodiments, the disclosed compositions are suitable for use in forming an after-applied surface coating or skin on a peripheral region of a honeycomb body or structure. In still other embodiments, disclosed compositions can be applied as a segment cement in order to join two or more honeycomb bodies or segments of honeycomb bodies together.

Once the composition has been applied to a honeycomb structure in a manner as described herein, the composition can be optionally dried and/or fired. The optional drying step can comprise first heating the composition at a temperature and for a period of time sufficient to at least substantially remove any liquid vehicle that may be present in the composition. As used herein, at least substantially removing any liquid vehicle includes the removal of at least 95%, at least 98%, at least 99%, or even at least 99.9% of the liquid vehicle present in the composition prior to firing. Exemplary and non-limiting drying conditions suitable for removing the liquid vehicle include heating the composition at a temperature of at least 50° C., at least 60° C., at least 70° C., at least 80° C., at least 90° C., at least 100° C., at least 110° C., at least 120° C., at least 130° C., at least 140° C., or even at least 150° C. In one embodiment, the conditions effective to at least substantially remove the liquid vehicle comprise heating the composition at a temperature in the range of from 60° C. to 120° C. Further, the heating can be provided by any conventionally known method, including for example, hot air drying, RF and/or microwave drying.

The optional firing step can include conditions suitable for converting the composition to a primary crystalline phase ceramic composition include heating the honeycomb with applied composition to a peak temperature of greater than 800° C., 900° C., and even greater than 1000° C. A ramp rate of about 120° C./hr during heating may be used, followed by a hold at the peak temperature for a temperature of about 3 hours, followed by cooling at about 240° C./hr.

Compositions disclosed herein can include those that set at a temperature of less than 200° C., such as a temperature of less than 100° C., and further such as a temperature of less than 50° C., including compositions that can be used in plugging processes employing "cold set" plugs. In cold set plugging, only drying of the plugging mixture is required to form a seal between the plugs and the channel walls of the honeycombs. When a cold set plugging process is employed, heating of the plugged honeycombs to temperatures in the 35-110° C. range can be useful to accelerate drying. In some cold set plugging processes, it is anticipated that final plug consolidation, including the removal of residual temporary binder bi-products and strengthening of the seals, can occur in the course of subsequent processing steps (e.g., in the course of catalyzation or canning) or during first use (e.g., in an exhaust system).

For example, exemplary compositions in which cold set plugging may be employed include those comprising a refractory filler that comprises at least one inorganic powder, such as at least one of aluminum titanate and cordierite, the inorganic powder having a median particle size ($D_{50}$) of from 15 to 50 microns, such as from 30 to 40 microns, and a gelled inorganic binder, such as gelled colloidal silica. At least one gelling agent, such as at least one of hydrochloric acid, sulfuric acid, nitric acid, citric acid, and acetic acid, ammonium hydroxide, sodium hydroxide, and triethanol amine (hereinafter "TEA") may be added either before (e.g., as a pre-mix with the gelled inorganic binder) or during batching in order to gel the inorganic binder. Such compositions can provide plugs that set in a porous ceramic honeycomb body (and be thereby permanently sealed to the channel walls) at a temperature of less than 200° C., such as less than 100° C., and further such as less than 50° C., including about 25° C. Such plugs can each have a push out strength of at least 10 bar.

The disclosure and scope of the appended claims will be further clarified by the following example.

Examples

A plugging composition according to embodiments disclosed herein (E1) as well as a comparative plugging composition (C1) were prepared and applied to the outlet channels of a honeycomb body, which was the same as a honeycomb body used to make a Corning® DuraTrap® aluminum titanate (AT) filter having 300 cells per square inch, 12 mil thick walls, and asymmetric cell technology (ACT), wherein the honeycomb body had a diameter of about 6.4 inches and an axial length of about 5.5 inches. Following application, the plugs were dried and then fired for about 3 hours at about 1,000° C. The components of the plugging compositions are set forth in Table 1 below.

TABLE 1

| Component | C1(wt %) | E1(wt %) |
|---|---|---|
| Aluminum titanate powder $D_{50}$ = 21 µm, $D_{10}$ = 7 µm, $D_{90}$ = 55 µm | 63.6 | — |
| Aluminum titanate powder $D_{50}$ = 35 µm, $D_{10}$ = 10 µm, $D_{90}$ = 92 µm | — | 64.6 |
| Colloidal Silica (Ludox ® HS-40) | 19.9 | 20.1 |
| Methylcellulose (Methocel ® F240) | 0.5 | 0.5 |
| Water | 12.2 | 10.9 |
| Citric Acid | 0.5 | 0.5 |
| Triethanol amine (TEA) | 3.3 | 3.4 |

Figure 2:
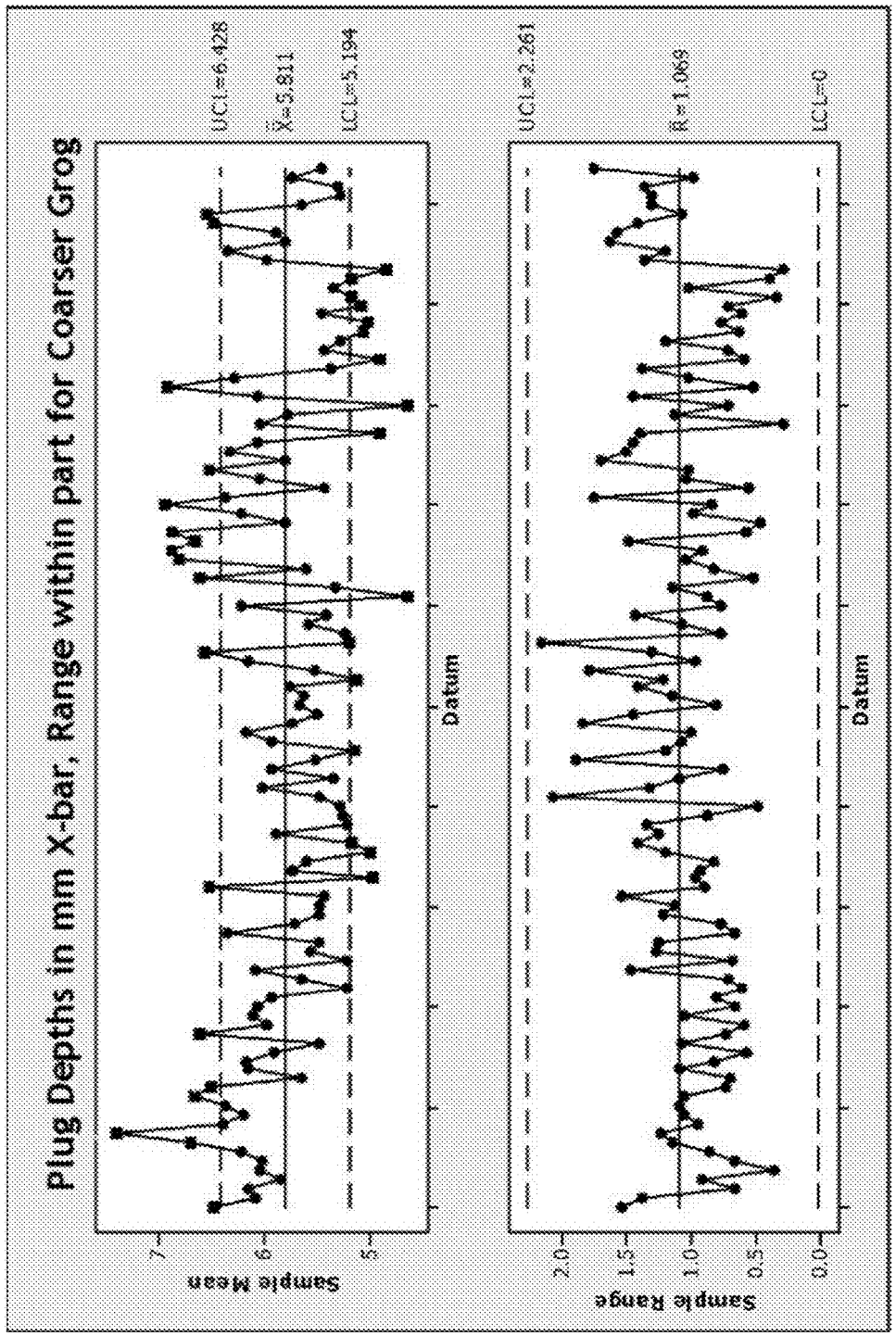
FIG. 2 plots average plug depth and plug depth range for plugs applied to a honeycomb structure according to an exemplary plugging composition.

FIG. 1 shows the average plug depth and depth range of plugs applied to the honeycomb from C1 and FIG. 2 shows the average plug depth and depth range of plugs applied to the honeycomb from E1. As can be seen from FIGS. 1 and 2, plugs applied from E1 had a shorter average plug depth (5.811 millimeters) than plugs applied from C1 (7.600 millimeters). Plugs applied from E1 also had a smaller depth range (1.07 millimeters) than plugs applied from C1 (2.46 millimeters). Accordingly, plugs applied from E1 had a depth range that was 18.4% of their average plug depth while plugs applied from C1 had a depth range that was 32.4% of their average plug depth.

Although not intended to be bound by theory, the inventors discovered friable plug centers according to exemplary embodiments caused by migration of the inorganic binder during the drying process. The friable plug centers lead to visual inconsistencies in sectioned plugs and possible reduced resistance to air erosion in the event that a plug is damaged. One method of minimizing binder migration may be to gel the binder. Manipulation of the drying conditions was conducted to affect some change to the appearance and erosion resistance of the plug centers, as well.

The inventors found the surprising result that involved the use of a poly disperse colloidal silica as the inorganic binder in the cold set plugs. This use of poly disperse colloidal silica as the inorganic binder was coupled with a reduced organic binder level, coupled with a lower water demand that enabled better particle packing in the cold set plug composition, and a denser cold set plug composition. Although pre-gelling the colloidal silica may be desirable under some conditions, it was not necessary. This poly disperse particle size distribution of the colloidal silica minimized binder migration, improved visual appearance in cross section, improved air erosion resistance by minimizing or eliminating the friable core, enhanced the process window enabling more inorganic binder, less organic binder and expanded the drying window of the cold set plug cement over other cold set plug compositions.

With the non-gelled inorganic binder in the cold set plugging composition, it was also found, according to certain exemplary embodiments that the refractory filler may include inorganic powder having a further reduced median particle size with improved results. For example, the refractory filler may include at least one inorganic powder having a median particle size ($D_{50}$) of at least 10 microns, such as a median particle size ($D_{50}$) of from 10 to 50 microns, and further such as a median particle size ($D_{50}$) of from 15 to 40 microns.

Experiments were conducted on Examples S1 and S2 of exemplary embodiments of the cold set cement compositions disclosed herein. The experimental compositions were prepared according to Table 2 and applied to the channels of a cordierite honeycomb body. The cordierite honeycomb body had 200 cells per square inch, 12 mil thick walls, the honeycomb body had a diameter of about 12 inches and an axial length of about 9 inches.

TABLE 2

| Component | S1 (wt %) | S2 (wt %) |
|---|---|---|
| Coarse Cordierite powder | 64 | 64 |
| Colloidal Silica (Ludox ® HS-40) | 24 | — |
| Colloidal Silica (Ludox ® PW50 EC) | — | 19.18 |
| Methylcellulose (Methocel ® A4M) | 1.19 | 1.19 |
| Water | 11.28 | 16 |

Figure 3:
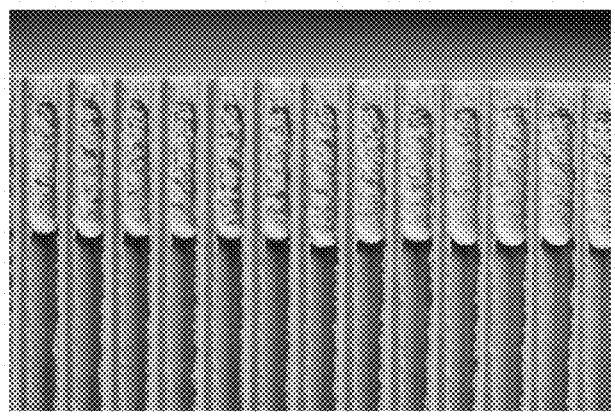
FIG. 3 shows samples of plugs applied to a honeycomb structure according to an exemplary embodiment, calcined at 600° C. for 3 hrs, and cross sectioned.

Following initial plant trials, data was collected on plug samples of Example S1 composition. Upon examining the collected data it was discovered that the interior of plugs of Example S1 composition were not homogenous. During assessment of the plugs, plug faces were calcined for 3 hrs at 600° C. to evaluate the plugs in a "worst case" condition that they might experience after downstream processing or in-service. The calcination is not necessarily part of the production process. Calcined cross sections of Example S1 composition show that the plugs generally have two different regions: a relatively hard outer shell and a softer, more friable core. FIG. 3 shows plugs of Example S1 composition in the honeycomb body after calcination, sectioning, and subjecting the exposed cold set plug cement to pressurized air erosion testing. Example S1 composition plug cement uses Ludox® HS-40, a colloidal silica having a narrow particle size distribution centered at approximately 12 nm, as the inorganic binder.

Figure 4:
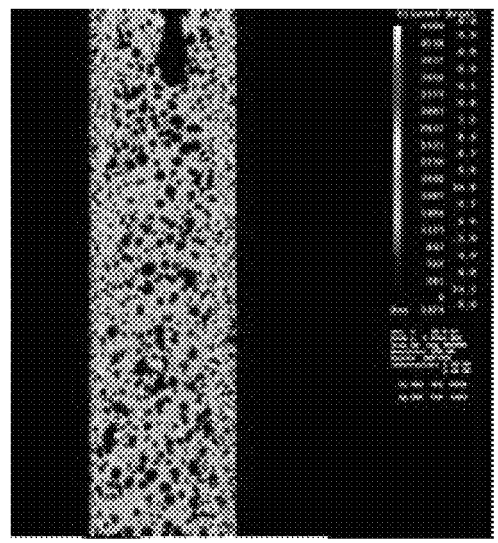
FIG. 4 shows a microprobe analysis of a cross sectioned plug applied to a honeycomb structure according to an exemplary embodiment.

The inventors postulate that the very small silica particles in Ludox® HS-40 may be free to travel with the water during the drying process toward the outer edges. Thus, the very small silica particles end up concentrated at the outer edges of the plug and form the hard shell. The silica migration hypothesis was corroborated by a silica scan done by microprobe analysis as shown in FIG. 4. The red/yellow color in the left image indicates higher silica concentration. The microprobe silica scan showed higher silica concentrations in and around the edges than in the center of an Example S1 composition plug without calcination.

To address the silica migration issue, a study was undertaken. As a result, a change was made from the small silica particle size Ludox® HS-40 to Ludox® PW50EC, a polydisperse colloidal silica with a much broader particle size range. Ludox® PW50EC has a particle size range $D_{50}$ of approximately 10-100 nm particle size distribution (PSD) as compared to about 12 nm $D_{50}$ in Ludox® HS-40. In theory, the larger particles of Ludox® PW50EC do not migrate as easily leaving them dispersed and in the center of the plug. The smallest of the particles in the Ludox® PW05EC are still able to migrate and bind the plug to the cell wall.

Figures 5A, 5B:
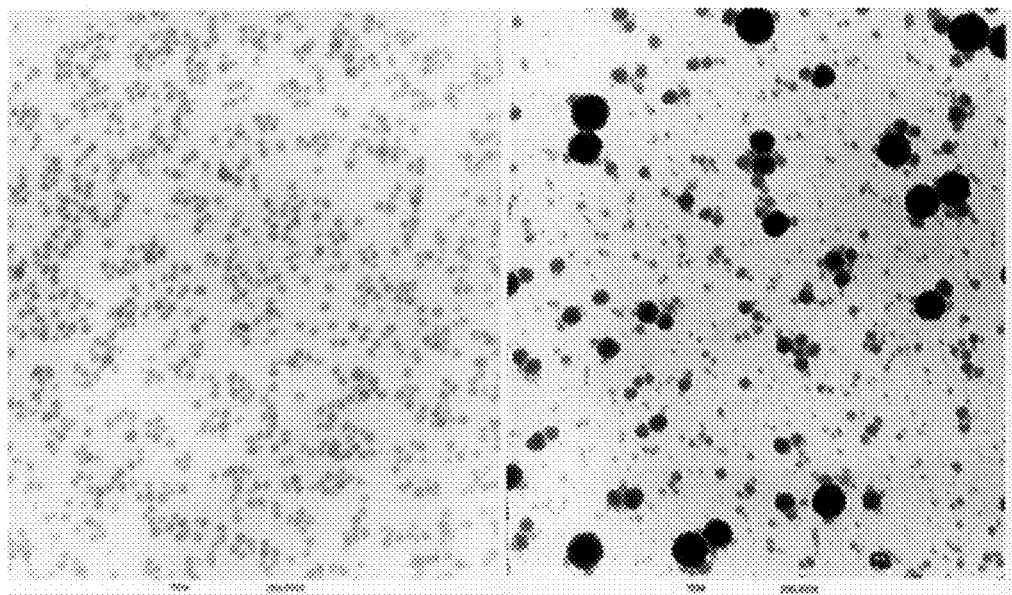
FIG. 5A shows a transmission electron microscopy image of a mono-modal disperse colloidal silica with a particle size range d50 of approximately 12 nm.
FIG. 5B shows a transmission electron microscopy image of colloidal silica having a poly-disperse mixture of larger particle size range d50 of approximately 70 nm and smaller particle size range d50 of approximately 12 nm.

FIG. 5A shows a transmission electron microscopy image (250,000×) of the mono-modal disperse colloidal silica with a particle size range $D_{50}$ of approximately 12 nm. FIG. 5B shows a transmission electron microscopy image (200,000×) of the colloidal silica having a poly-disperse mixture of larger particle size range $D_{50}$ of approximately 70 nm and smaller particle size range $D_{50}$ of approximately 12 nm.

Table 3 shows the particle size distribution (PSD), surface area, wt % silica for Examples S1-S15 studied. These Examples were prepared as described above except for the different colloidal silicas as indicated in Table 3. For each Example the results of cross section, erosion, plug depth, and plug strength testing as described herein are presented. For the cross section, erosion, plug depth, and plug strength a threshold was established as a performance indicator. The letter 'A' indicates the Example performed at or above this threshold. The letter 'B' indicates the Example performed below this threshold. Table 3 also includes the product and supplier of the silica used in each Example S1-S15. Due to variation in each product from the supplier, the particle size distribution (PSD) is presented as the typical PSD in Table 3 as is the Surface Area in square meters per gram ($m^2/g$) and weight percent (wt %) silica. In Example S5, the silica content of the product was too low to achieve a plugging composition denoted by the letter 'C'.

As can be seen by the results in Table 3, the polydisperse colloidal silica Example S2 outperformed the monomodal fine colloidal silica Example S1. Further Examples S3, S4, and S5 also performed below the threshold denoted by 'B' in Table 3. However, Examples S6-S15 performed at or above the threshold denoted by 'A' in Table 3.

Figure 6A:
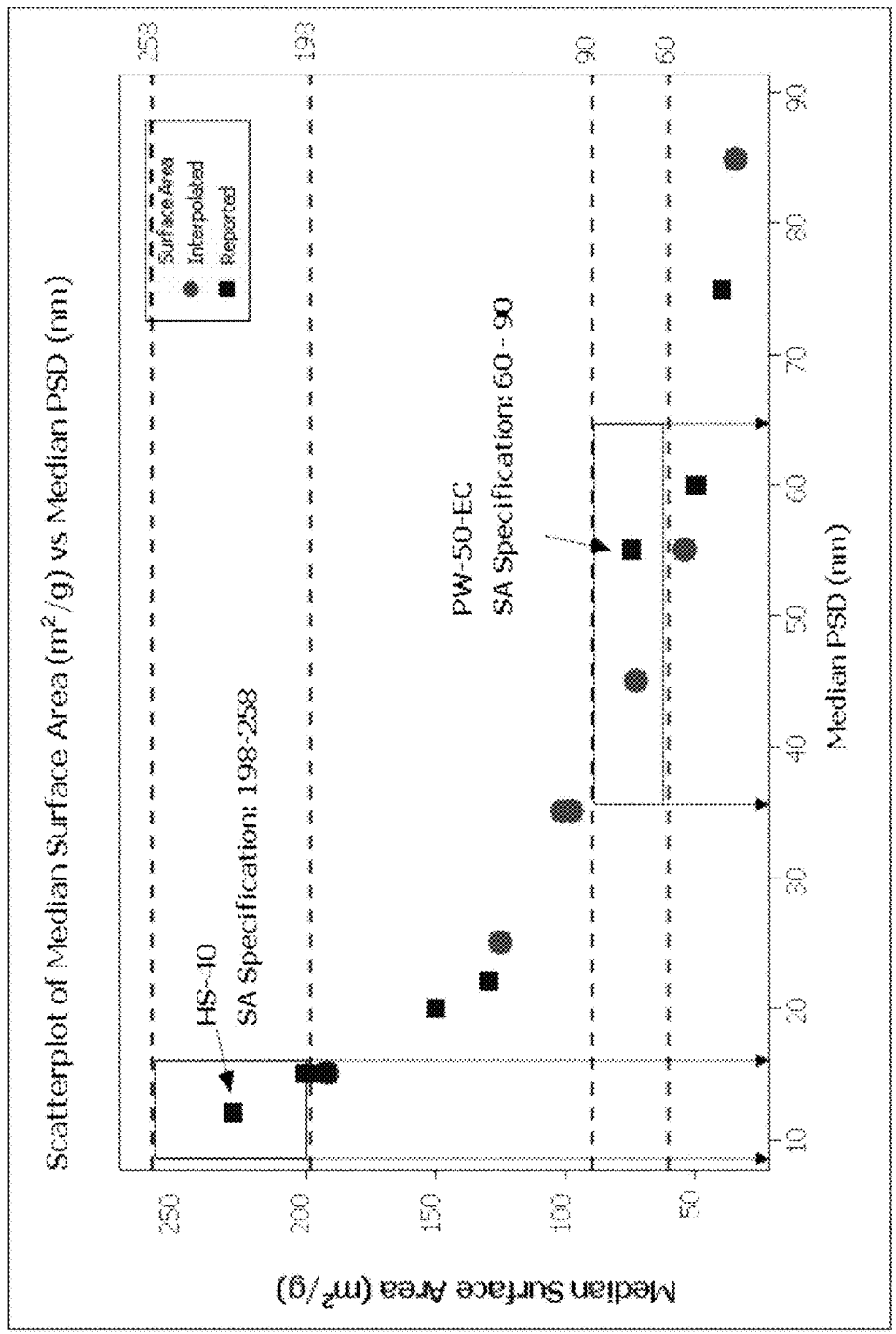
FIGS. 6A and 6B are plots of particle size distribution (PSD) and surface area for colloidal silica used in exemplary embodiments of the composition disclosed herein.
Figure 6B:
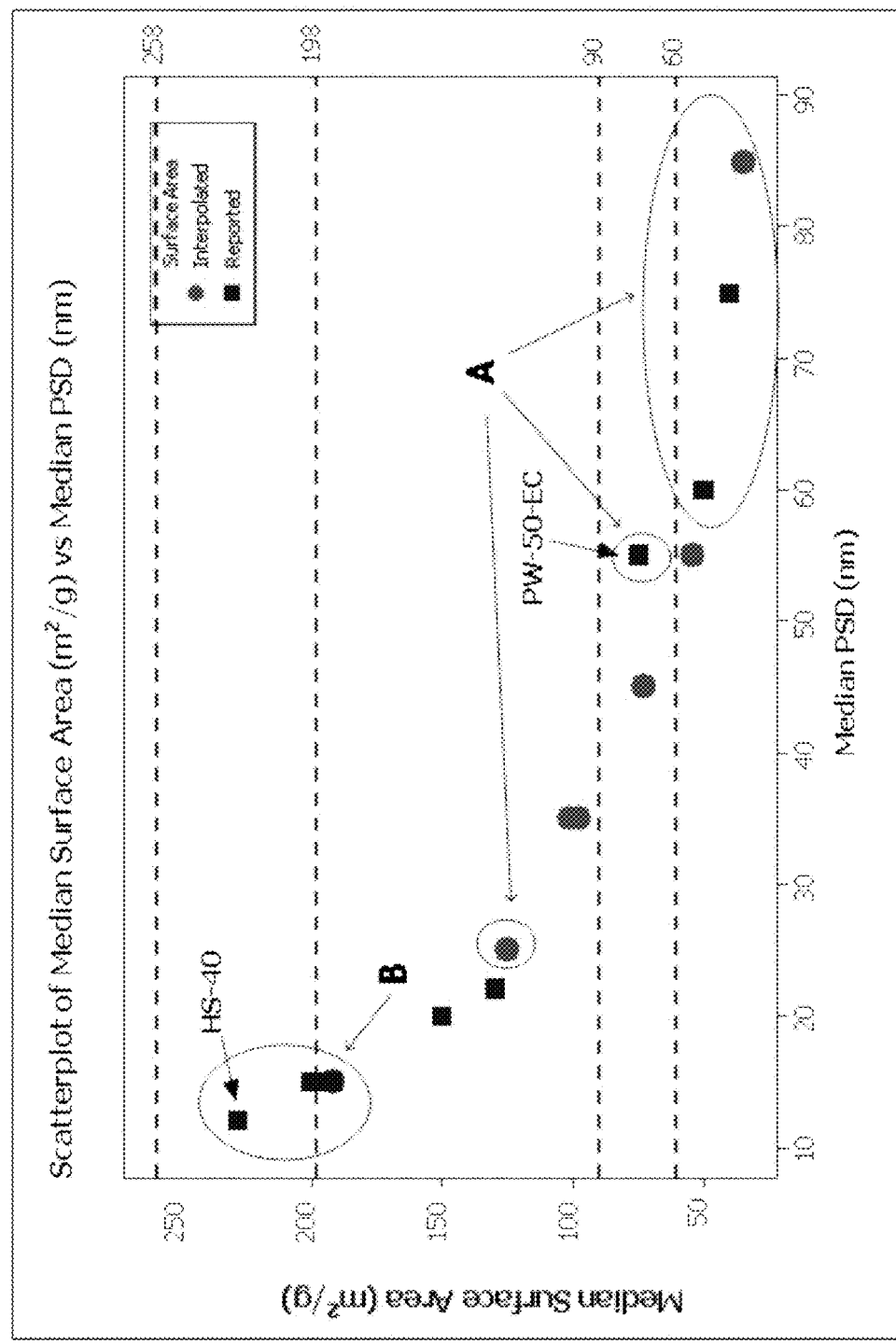

FIGS. 6A and 6B show the relationship between particle size distribution (PSD) and surface area for colloidal silicas in Examples S1-S15. The surface area specification tightly limits possible PSD range. The Ludox® PW50EC, Example S2, produced superior results based on specified Surface Area limits as illustrated in FIGS. 6A and 6B.

TABLE 3

| Example No. | Product | PSD (nm) | Surface Area ($m^2/g$) | Silica wt % | Cross Section | Erosion | Plug Depth | Plug Strength |
|---|---|---|---|---|---|---|---|---|
| S1 | HS-40 by GRACE | 12 | 228 | 40 | B | B | B | A |
| S2 | PW-50 by GRACE | 55 | 75 | 50 | A | A | A | A |
| S3 | Snowtex ST-40 by NISSAN | 15 | 191 | 40.5 | B | B | B | A |
| S4 | 1142 by NALCO | 15 | 200 | 40 | B | B | B | A |
| S5 | Snowtex ST-20 L by NISSAN | 35 | 102 | 20.5 | C | C | C | C |
| S6 | IDISIL SI-1540 by EVONIK DEGUSSA | 15 | 191 | 40 | A | A | A | A |
| S7 | 1050 by NALCO | 20 | 150 | 50 | A | A | A | A |

TABLE 3-continued

| Example No. | Product | PSD (nm) | Surface Area (m²/g) | Silica wt % | Cross Section | Erosion | Plug Depth | Plug Strength |
|---|---|---|---|---|---|---|---|---|
| S8 | TM-50 by GRACE | 22 | 130 | 50 | A | A | A | A |
| S9 | Snowtex ST-50 by NISSAN | 25 | 141 | 48 | A | A | A | A |
| S10 | IDISIL EM-3530K by EVONIK DEGUSSA | 35 | 102 | 30 | A | A | A | A |
| S11 | IDISIL SI-4540 by EVONIK DEGUSSA | 45 | 73 | 40 | A | A | A | A |
| S12 | IDISIL SI-5530 by EVONIK DEGUSSA | 55 | 54 | 30 | A | A | A | A |
| S13 | 1060 by NALCO | 60 | 50 | 50 | A | A | A | A |
| S14 | 2329 by NALCO | 75 | 40 | 40 | A | A | A | A |
| S15 | Snowtex ST-ZL by NISSAN | 85 | 35 | 40.5 | A | A | A | A |

A range of organic and inorganic binder (colloidal silica) levels were investigated. Samples having 25, 30 and 35 wt % poly-disperse colloidal silica (Ludox® PW50EC) super addition were made with 1, 1.5, 2, 2.5, and 3 wt % methylcellulose (Methocel® A4M) super addition. It was discovered that the poly-disperse colloidal silica enables higher inorganic binder levels and lower organic binder levels as compared to compositions comprising the mono-modal disperse colloidal silica, for example, as in Example S1. A similar investigation was performed with compositions comprising the mono-modal disperse colloidal silica (Ludox® HS-40) on production equipment. It was found that higher levels of mono-modal disperse colloidal silica compositions lead to higher pressures and leaking seals of the production equipment. Thus, mono-modal disperse colloidal silica compositions were deemed to be less desirable from a production process standpoint.

Figure 7:
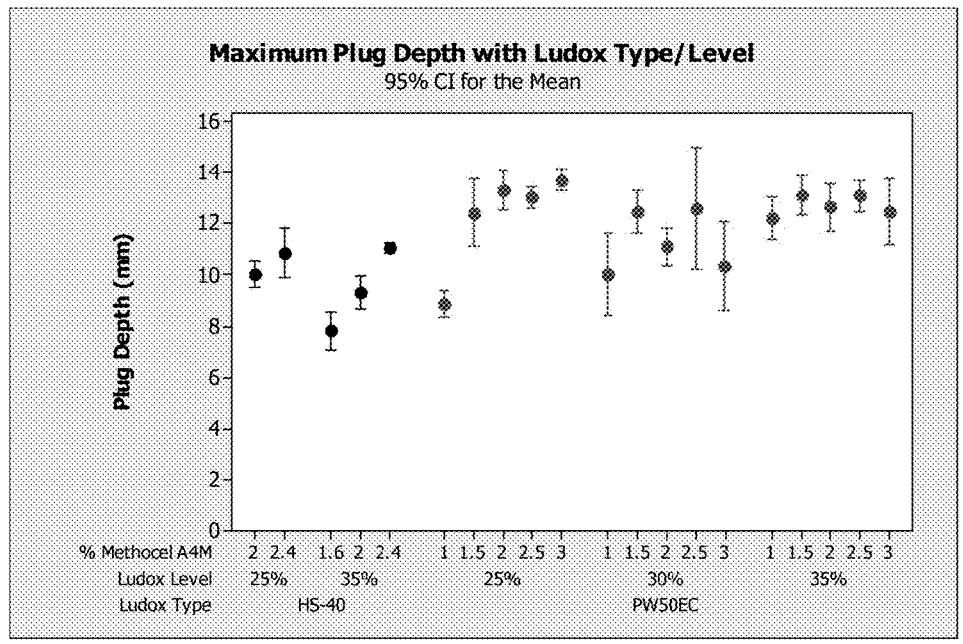
FIG. 7 shows a plot of plug depth of compositions according to exemplary embodiments.

From plug depth measurements on parts plugged with a deep cement dam (i.e., enough cement to make very long plugs, for example greater than about 10 to 12 mm), it was found that poly-disperse colloidal silica enables deep plugs at reduced methylcellulose levels. For example, mono-modal disperse colloidal silica requires about 2.5 wt % methylcellulose at 25 wt % mono-modal disperse colloidal silica to achieve acceptable plug depths. FIG. 7 shows a plot of plug depth of compositions according to exemplary embodiments. In this study, only the 25 wt % poly-disperse colloidal silica at the lowest organic binder level did not achieve a deep plug depth. The 30 wt % poly-disperse colloidal silica at the lowest organic level achieved an acceptable plug depth, although being borderline. As evident from FIG. 7, more mono-modal disperse colloidal silica makes the plug cement rheology worse (limits plug depth) while increased poly-disperse colloidal silica improves plug cement rheology (enables deep plug depth capability at lower methylcellulose levels).

Air erosion testing is a simple lab test done on calcined parts (heat treated at 600° C. for 3 hours) to mimic the ash cleaning process that a particulate filter (PF), for example, a diesel particulate filter (DPF), may undergo during its lifetime. The plug face was sliced in half to expose the center of the plugs. For example, FIG. 3 shows the centers of the plugs is the area of the cold set cement having the mono-modal disperse colloidal silica composition where friability was observed. The lowest pressure tested was 30 psi and the maximum was 130 psi. Products that performed above the threshold were those that passed 130 psi. The air erosion testing results are plotted in a graph shown in FIG. 8. The Applicants observed that the organic binder level contributed to the plug center friability. Therefore, achieving an acceptable plug cement rheology to produce deep plug depths while lowering the amount of organics is beneficial to reducing the friability of the centers of the plugs. The poly-disperse colloidal silica improves plug cement composition to enable deep plug depths while lowering the amount of organics to reduce the friability of the centers of the plugs.

Plug pushout testing was performed to determine plug adherence to the cell wall (plug strength) by utilizing a load cell to push on the plug with a square pin from the bottom of the plug. The plug depth was measured and then the force required to break through the plug and remove it from the honeycomb body face was recorded.

Figure 9:
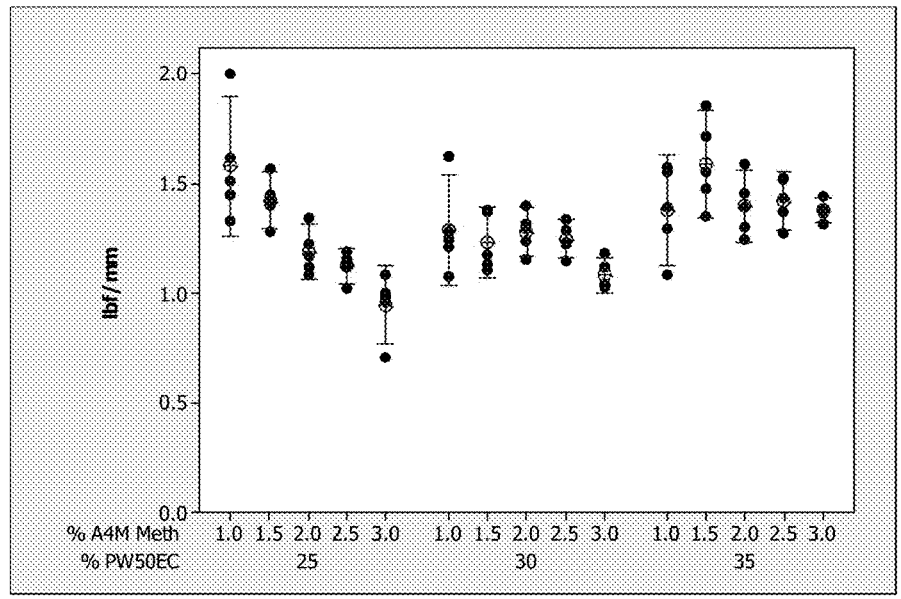
FIG. 9 shows a plot of plug push out testing of plugs applied to honeycomb structure according to exemplary embodiments.

The plug pushout testing results are graphically plotted as illustrated in FIG. 9. From the plug pushout results shown in FIG. 9, it can be seen that increased levels of poly-disperse colloidal silica improves plug cement composition to dampen the effect of organic binder level on plug strength. For example, at the 25 wt % level of poly-disperse colloidal silica, the pushout strength per mm plug depth of calcined plugged honeycomb structure decreases with an increase in methylcellulose organic binder. In contrast, at the 30 and 35 wt % level of poly-disperse colloidal silica, the pushout strength per mm plug depth of calcined plugged honeycomb structure hardly decreases with an increase from 1 to 3 wt % methylcellulose organic binder.

Figure 10:
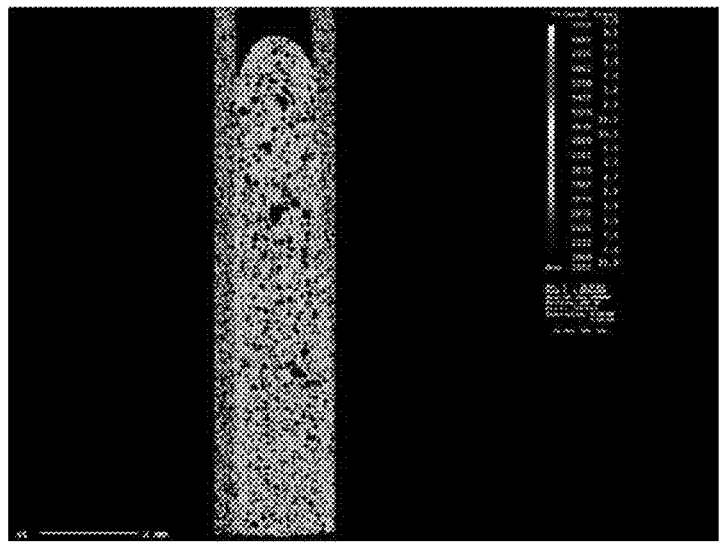
FIG. 10 shows a microprobe silica scan of a cross sectioned plug applied to a honeycomb structure according to an exemplary embodiment.

FIG. 10 shows a microprobe silica scan of a cross sectioned plug applied to a honeycomb structure according to an exemplary embodiment. The microprobe silica scan illustrates a much more uniform distribution of silica across the plug comprising poly-disperse colloidal silica than the distribution of silica across the plug comprising mono-modal disperse colloidal silica. FIG. 10 indicates less silica migration occurred during drying of the plug comprising poly-disperse colloidal silica than during drying of the plug comprising mono-modal disperse colloidal silica. The yellow/red color in the microprobe image of FIG. 10 indicates silica concentration in the plug comprising the cold set cement having poly-disperse colloidal silica. The microprobe image of FIG. 10 indicates silica is much more evenly dispersed through the plug than in the microprobe image of FIG. 4 for the plug comprising the cold set cement having mono-modal disperse colloidal silica.

Additionally, the Applicants found that increasing batch density by removing organic binder and increasing colloidal silica levels impeded silica migration by decreasing the size of channels between particles, that is, better particle packing was achieved in the cold set cement plugs comprising the poly-disperse colloidal silica. A comparison of the density of the cement plugs confirmed the closer particle packing in the cement plugs comprising the poly-disperse colloidal silica. The density of the cement plugs comprising the poly-disperse colloidal silica is about 6% greater than the density of the cement plugs comprising the mono-modal disperse colloidal silica. Another unexpected benefit of using the poly-disperse colloidal silica in the cold set cement is that reducing the organic binder means less water was needed in the cement. Table 4 shows the average density of seven exemplary embodiments of cold set cement batches having the mono-modal disperse colloidal silica and the average density of eight exemplary embodiments of cold set cement batches having the poly-disperse colloidal silica mixed in the lab.

TABLE 4

| Cold set cement composition | Density (g/mL) | Number of batches |
|---|---|---|
| mono-modal disperse colloidal silica | 1.46 | 7 |
| poly-disperse colloidal silica | 1.55 | 8 |

Figure 8:
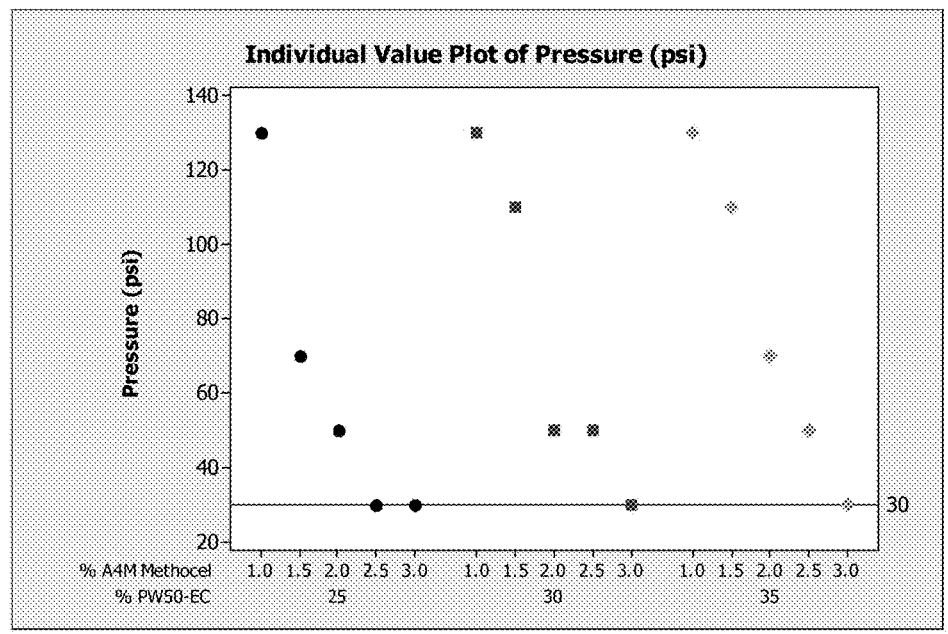
FIG. 8 shows a plot of air erosion testing of plugs applied to a honeycomb structure according to an exemplary embodiment, calcined at 600° C. for 3 hrs, and sectioned before testing.
Figure 11:
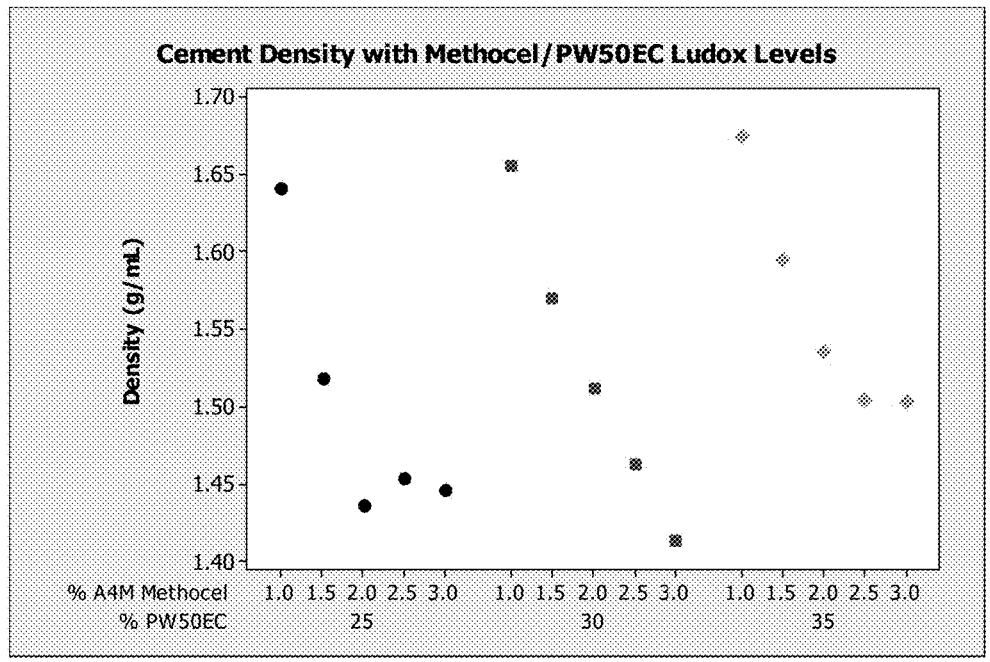
FIG. 11 shows a plot of plug density according to exemplary embodiments of plug composition.

FIG. 11 shows a plot of plug density according to exemplary embodiments of plug composition. The densities of the examples plotted in FIGS. 8 and 9 are shown in FIG. 11. As the amount of organic binder is decreased due to the improved rheological properties resulting from the poly-disperse colloidal silica, the graph in FIG. 11 illustrates that the density increases. In addition, for the same amount of methylcellulose in the batch composition, the cold set cement plug density increases when the amount of poly-disperse colloidal silica is increased as shown in FIG. 11.

Figure 12:
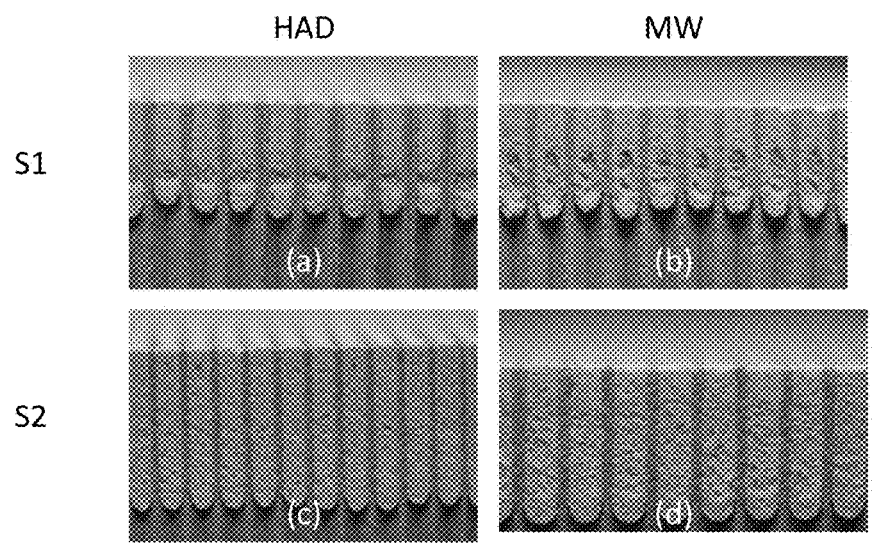
FIG. 12 shows sectioned samples of exemplary embodiments of plug compositions applied to a honeycomb structure under hot air drying (HAD) and microwave drying (MW).

Samples according to exemplary embodiments of the disclosed composition were prepared as set forth in Table 2 (above) to make Example S1 and Example S2 cold set cement compositions. The same wt % cordierite (solids loading) was used in Examples S1 and S2, with the only difference being the Ludox® type (amounts are adjusted to account for the difference in percent silica in the two types of Ludox®). FIG. 12 shows Example S1 and S2 compositions of cold set cement plugs introduced in honeycomb body cells, dried, and sectioned. The sectioned plugs were then subjected to pressurized air at 130 psi. FIG. 12 shows sectioned Example S1 plugs after hot air drying (HAD) at (a) and after microwave drying at (b). The sectioned Example S1 plugs hot air dried (a) and microwave dried (b) exhibited a friable center. FIG. 12 shows sectioned Example S2 plugs after hot air drying (HAD) at (c) and after microwave drying (MW) at (d). As can be seen from comparing the photographs of sectioned plugs of Example S1 (a) and Example S2 (c) in FIG. 12, the polydisperse colloidal silica eliminates the appearance of a friable center when plugs were hot air dried. Comparing the photographs of sectioned plugs of Example S1 (b) and Example S2 (d) in FIG. 12, the polydisperse colloidal silica minimizes the appearance of a friable center when plugs were microwave dried.

Figure 13:
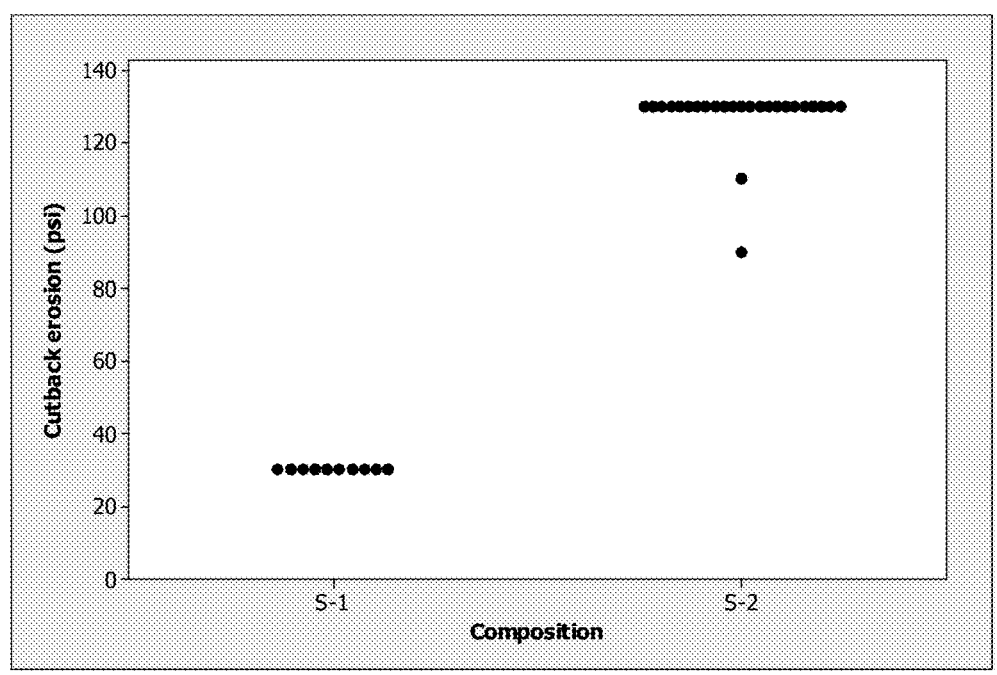
FIG. 13 shows cutback erosion results of exemplary embodiments.
Figure 14:
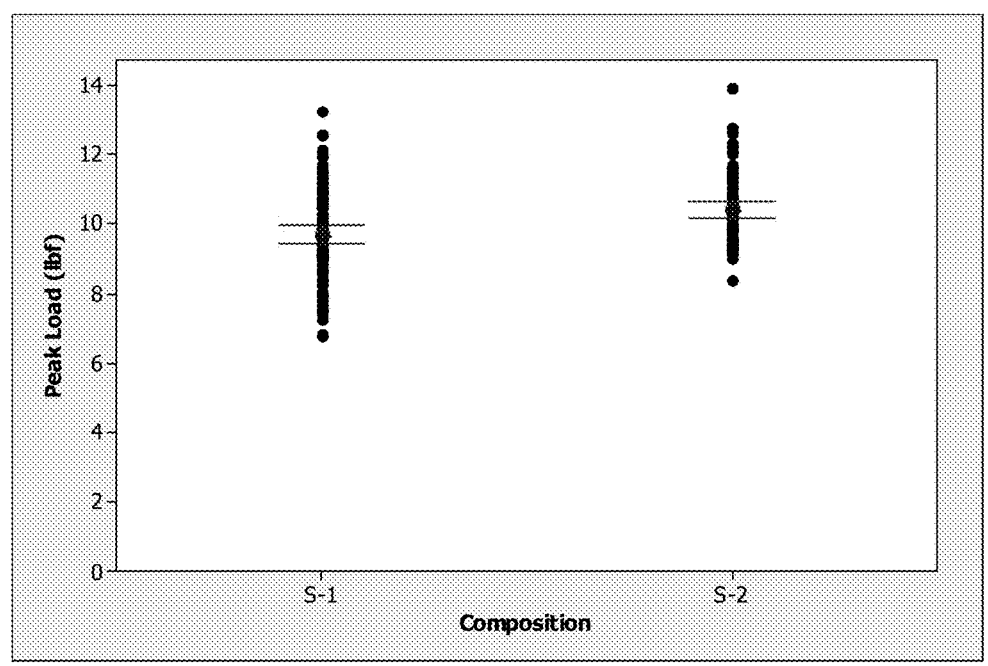
FIG. 14 shows plug push out test results of exemplary embodiments.

FIG. 13 shows cutback erosion results of exemplary embodiments of the disclosed compositions. In the cutback erosion tests, plugs of the Example S2 composition comprising the polydisperse colloidal silica demonstrated a substantially higher cutback erosion pressure compared to the plugs of the Example S1 composition comprising the mono-modal disperse colloidal silica. FIG. 14 shows plug push out test results of exemplary embodiments of the disclosed compositions. The use of polydisperse colloidal silica according to exemplary embodiments disclosed herein improved the visual appearance of the sectioned cold set plug cement and minimized the friable nature of the center of the plug as illustrated by the cutback erosion results. Additionally, the polydisperse colloidal silica of the Example S2 plug cement composition does not adversely affect the plug cement adherence to the honeycomb cell wall as shown in the plug pushout results of FIG. 14.

According to exemplary embodiments of the disclosure the polydisperse colloidal silica inorganic binder may have a first particle size distribution and a second particle size distribution greater than the first particle size distribution. The first particle size distribution and the second particle size distribution may partially overlap so that for the purposes of this disclosure, a first distribution may be understood to have a first peak or first set of peaks and the second particle size distribution may have a second peak or second set of peaks. In the instance of sets of peaks, the uppermost peak of the first set would be the most adjacent peak to the lower most of the second set and perhaps even partially overlapping.

For example, in one set of exemplary embodiments, the first particle size distribution has a median particle size ($D_{50}$) of at least 10 nm, such as a median particle size of ($D_{50}$) of from 10 to 50 nm, and further such as a median particle size ($D_{50}$) of from 10 to 40 nm, such as a median particle size ($D_{50}$) of from 10 to 25 nm, and even further such as a median particle size ($D_{50}$) of from 15 to 35 nm, and yet even further such as a median particle size ($D_{50}$) of from 20 to 35 nm. As a further example, in one set of exemplary embodiments, the first particle size distribution has a median particle size ($D_{50}$) of less than 20 nm, such as a median particle size of ($D_{50}$) of less than 25 nm.

In one set of exemplary embodiments, the second particle size distribution has a median particle size ($D_{50}$) of at least 40 nm, such as a median particle size of ($D_{50}$) of from 40 to 300 nm, such as a median particle size of ($D_{50}$) of from 40 to 100 nm, and further such as a median particle size ($D_{50}$) of from 50 to 250 nm, and even further such as a median particle size ($D_{50}$) of from 60 to 100 nm, and yet even further such as a median particle size ($D_{50}$) of from 50 to 95 nm.

For example, the polydisperse colloidal silica inorganic binder may include any combination of these first particle size distributions and second particle size distributions, for example, the first particle size distribution has a median particle size ($D_{50}$) of from 10 to 25 nm and the second particle size distribution has a median particle size ($D_{50}$) of from 40 to 100 nm.

According to exemplary embodiments of the disclosure the first particle size distribution and the second particle size distribution may constitute greater than 35 wt % of the polydisperse colloidal silica inorganic binder particles. For example, in one set of exemplary embodiments, the first particle size distribution and the second particle size distribution may constitute greater than 40 wt % of the polydisperse colloidal silica particles, such as greater than 50 wt %, such as greater than 60 wt %, and further such as greater than 70 wt %, and even further such as greater than 80 wt % and yet even further such as greater than 90 wt %.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention as set forth in the appended claims. Since modifications combinations, sub-combinations and variations of the disclosed embodiments incorporating the spirit and substance of the disclosure may occur to persons skilled in the art, the disclosure should be construed to include everything within the scope of the appended claims and their equivalents.

What is claimed is:

1. A plugging composition for applying to a honeycomb body having a plurality of parallel channels, the composition comprising:
    a refractory filler having a particle size distribution;
    an organic binder;
    an inorganic binder; and
    a liquid vehicle;
    wherein the inorganic binder comprises a polydisperse colloidal silica, the polydisperse colloidal silica comprising a first particle size distribution having a $D_{50}$ ranging from about 10 nm to about 40 nm, and a second particle size distribution greater than the first particle size distribution.

2. The composition of claim 1, wherein the refractory filler comprises at least one inorganic powder selected from the group consisting of cordierite, mullite, aluminum titanate, silicon carbide, silicon nitride, calcium aluminate, beta-eucryptite, and beta-spodumene.

3. The composition of claim 2, wherein the refractory filler has a median particle size ($D_{50}$) of from 10 to 50 microns.

4. The composition of claim 1, wherein the polydisperse colloidal silica comprises a surface area of less than or equal to about 150 $m^2/g$.

5. The composition of claim 1, wherein the composition sets at a temperature of less than 200° C.

6. The composition of claim 1, wherein the inorganic binder comprises non-gelled colloidal silica.

7. The composition of claim 1, wherein the second particle size distribution comprises a $D_{50}$ of greater than about 40 nm and less than about 300 nm.

8. The composition of claim 7, wherein at least 15 wt % of the first particle size distribution comprises a $D_{50}$ of no greater than about 25 nm and at least 15 wt % of the second particle size distribution comprises a $D_{50}$ of no less than about 50 nm.

9. The composition of claim 7, wherein the weight percent of the first particle size distribution and the second particle size distribution constitutes greater than 35 wt % of the particles in the polydisperse colloidal silica.

10. A method for applying a plugging composition to a honeycomb body having a plurality of parallel channels, the method comprising:
    applying a plugging composition to at least a portion of the plurality of parallel channels of the honeycomb body to form plugs within the portion of the plurality of parallel channels, wherein the plugging composition comprises: a refractory filler having a particle size distribution; an organic binder; an inorganic binder; and a liquid vehicle; wherein the inorganic binder comprises a polydisperse colloidal silica, the polydisperse colloidal silica comprising a first particle size distribution having a $D_{50}$ ranging from about 10 nm to about 40 nm, and a second particle size distribution greater than the first particle size distribution.

11. The method of claim 10, further comprising setting the composition at a temperature of less than 200° C.

12. The method of claim 10, wherein the first particle size distribution comprises a $D_{50}$ of less than about 25 nm.

13. The method of claim 10, wherein the polydisperse colloidal silica comprises a surface area of less than or equal to about 150 $m^2/g$.

14. The method of claim 10, wherein the inorganic binder comprises non-gelled colloidal silica.

* * * * *

UNITED STATES PATENT AND TRADEMARK OFFICE
CERTIFICATE OF CORRECTION

PATENT NO. : 10,301,220 B2
APPLICATION NO. : 15/163429
DATED : May 28, 2019
INVENTOR(S) : Keith Norman Bubb et al.

It is certified that error appears in the above-identified patent and that said Letters Patent is hereby corrected as shown below:

On the Title Page

On page 2, in Column 2, item (56), Other Publications, Line 4, delete "Swededn Recieved" and insert -- Sweden Received --, therefor.

On page 2, in Column 2, item (56), Other Publications, Line 5, delete "recieved" and insert -- received --, therefor.

Signed and Sealed this
Twenty-second Day of October, 2019

Andrei Iancu
*Director of the United States Patent and Trademark Office*